(12) United States Patent
Kruiskamp (10) Patent No.: US 12,431,876 B1
(45) Date of Patent: Sep. 30, 2025

(54) CIRCUITRY AND METHOD THEREOF

(71) Applicant: Renesas Design Netherlands B.V., 's-Hertogenbosch (NL)

(72) Inventor: Marinus Wilhelmus Kruiskamp, 's-Hertogenbosch (NL)

(73) Assignee: Renesas Design Netherlands B.V., 's-Hertogenbosch (NL)

( * ) Notice: Subject to any disclaimer, the term of this patent is extended or adjusted under 35 U.S.C. 154(b) by 0 days.

(21) Appl. No.: 18/743,864

(22) Filed: Jun. 14, 2024

(51) Int. Cl.
| | |
|---|---|
| *H03K 3/03* | (2006.01) |
| *H03B 5/04* | (2006.01) |
| *H03K 3/0233* | (2006.01) |
| *H03K 5/135* | (2006.01) |
| *H03K 19/00* | (2006.01) |

(52) U.S. Cl.
CPC ............ *H03K 3/0322* (2013.01); *H03B 5/04* (2013.01); *H03K 3/0233* (2013.01); *H03K 3/03* (2013.01); *H03K 5/135* (2013.01); *H03K 19/0027* (2013.01)

(58) Field of Classification Search
CPC .... H03K 3/0322; H03K 3/0233; H03K 5/135; H03K 19/0027; H03K 3/03; H03B 5/04
USPC .............. 331/57, 45, 46, 47, 2; 327/124
See application file for complete search history.

(56) References Cited

U.S. PATENT DOCUMENTS 6,456,159 B1 * 9/2002 Brewer ............... H03F 3/45977
330/253
2016/0241249 A1 * 8/2016 Balamurugan ......... H04L 25/03

* cited by examiner

*Primary Examiner* — Arnold M Kinkead
(74) *Attorney, Agent, or Firm* — SCULLY, SCOTT, MURPHY & PRESSER, P.C.

(57) ABSTRACT

Described herein is a circuitry for enabling synchronized chopping for ring oscillators. The circuitry may include a differentially arranged pair of ring oscillators; a chopping logic configured to perform a chopping operation for the ring oscillators; and a control logic configured to: stop each ring oscillator in a predefined state; enable the chopping logic to perform the chopping operation after both ring oscillators are stopped; and restart both ring oscillators after the chopping operation is completed.

19 Claims, 8 Drawing Sheets

CIRCUITRY AND METHOD THEREOF

TECHNICAL FIELD

The present disclosure is generally directed to techniques related to ring oscillators, such as Current Controlled Oscillators (CCOs) and/or Voltage Controlled Oscillators (VCOs), and more particularly to techniques related to enabling synchronized chopping operations for these oscillators.

BACKGROUND

Ring oscillators, such as Current Controlled Oscillators (CCOs) and/or Voltage Controlled Oscillators (VCOs), may be used to convert analog signals to digital signals. These circuits have become popular in analog-to-digital conversion recently because they scale very well with modern processes.

Figure 1:
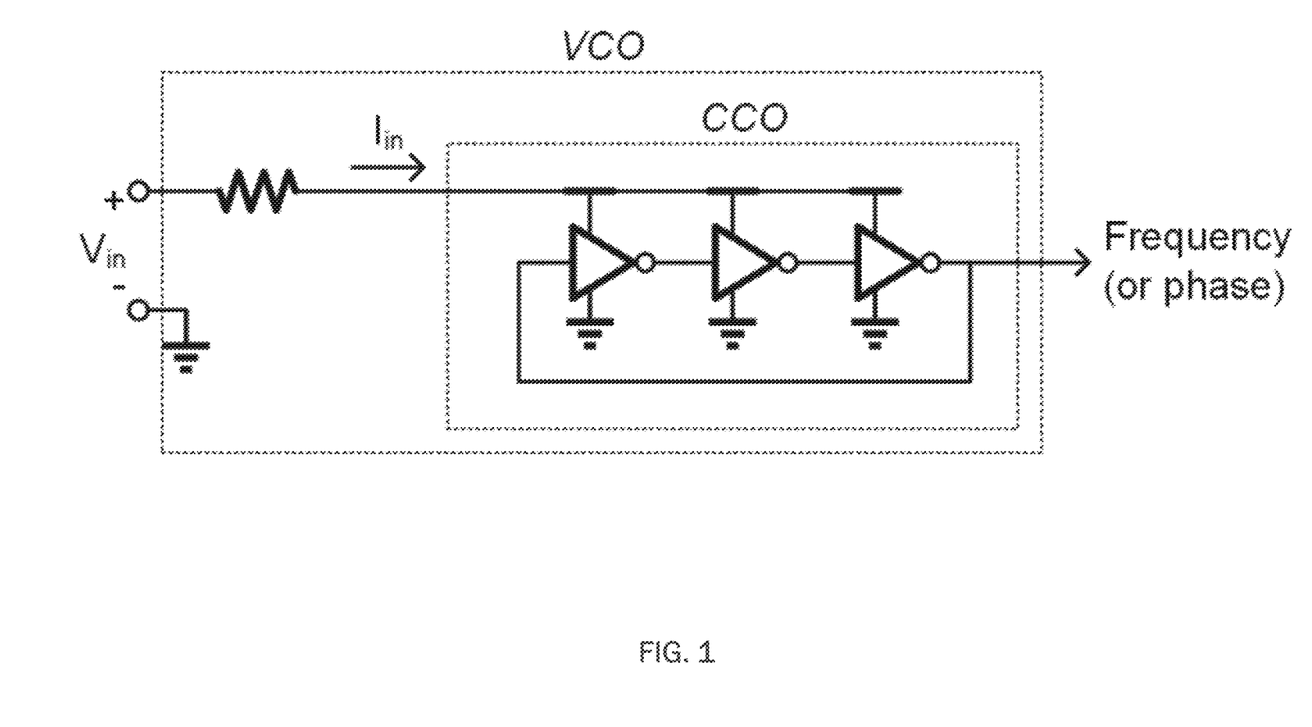

A simple illustrative example of a typical CCO implementation is depicted in FIG. 1. In this example, an odd number (e.g., 3) of inverters are arranged to form a ring (thus sometimes also referred to as a ring oscillator), with the supply current as input for the CCO and the frequency or phase of the ring oscillator as the output. This example also illustratively shows a possible example implementation of a VCO which can simply be a CCO with a resistor at the input to convert an input voltage to an input current.

The output can be the number of completed cycles of the ring oscillator. In that case, a counter driven by the CCO or VCO may be sufficient for generating the output. The output may also include information on the phase (or put differently, how far the current cycle has progressed). In that case, the state of the internal signals of the ring oscillator may be used to derive the phase, for example in addition to a counter that counts the number of completed cycles.

Figure 2:
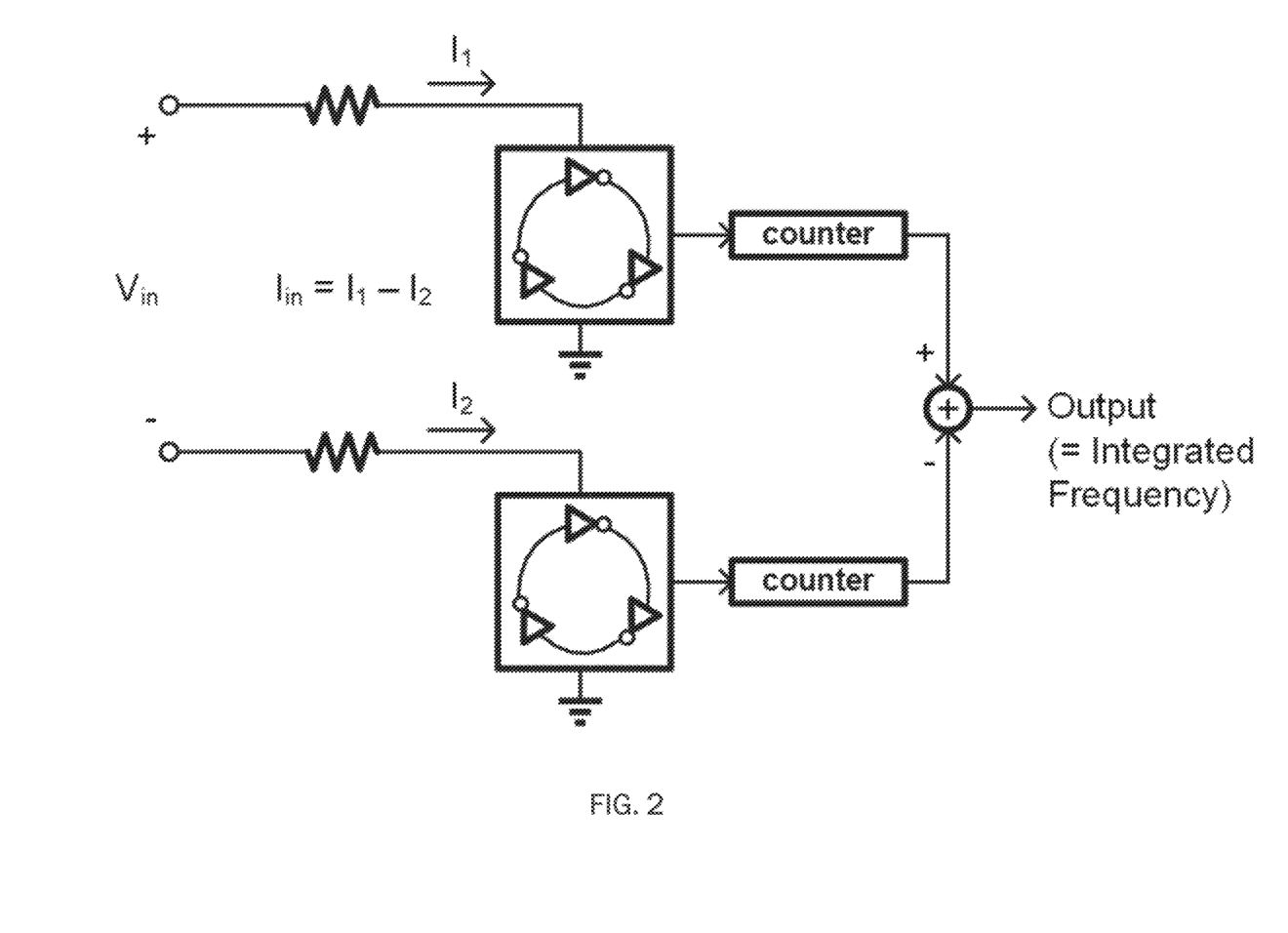

In possible implementations, CCOs or VCOs may be used in a differential manner, for example to reduce non-linearities and offset. A possible example of a differential arrangement is illustratively depicted in FIG. 2. Details thereof are not elaborated here for the sake of conciseness.

Typically, these circuits are often used in high-speed and/or medium-resolution applications. In these applications, the 1/f-noise (or sometimes also referred to as flicker-noise) of the ring oscillator is not significant. In high-accuracy applications however, such as audio applications or the like, the 1/f noise of the ring oscillators would be significant and may call for reduction. In some possible cases, this may be done by using large devices, however at the cost of a lot of additional power consumption. In some other possible cases, so-called chopping operations may be added.

However, in existing techniques where chopping is applied, this is only done at the gain stage driving the VCOs or CCOs, but not the VCOs or CCOs themselves; or chopping is done a-synchronously with the frequency of the VCOs/CCOs. As a result, the phase of the oscillators may only be detected with a certain resolution (in case of a counter the resolution is complete cycles of the oscillator). This in turn results in an error during each chopping action in the sense that each oscillator has consumed a certain amount of current which is not yet detected by the phase detector (counter).

This sets a limit to the maximum chopping frequency (otherwise the effects of these errors might add up too much) and therefore further sets a limit to the maximum frequency of the 1/f noise that can be removed. The application in which this is a problem is in low-power audio circuits: low-power means small devices (which then translates to high 1/f noise), whereas audio applications typically require high resolution and therefore low noise in the audio band, which is typically significantly below the 1/f corner frequency.

Therefore, there appears to exist a need for an improved implementation or mechanism that can overcome some or all of the above-illustrated problems associated with conventional techniques; and more particularly, that can enable synchronized chopping operations and at the same time avoid the errors that are introduced by the chopping.

SUMMARY

In view of some or all of the above-illustrated technical problems, the present disclosure generally provides a circuitry and a corresponding method for enabling synchronized chopping for ring oscillators, having the features of the respective independent claims.

According to an aspect of the disclosure, there is provided a circuitry (sometimes also referred to as a circuit assembly, or the like). Such circuitry may be implemented for enabling synchronized chopping (operation/process) for ring oscillators.

In particular, the circuitry may comprise a differentially arranged pair of ring oscillators. The ring oscillators may be CCOs, VCOs, a combination thereof, or the like. The ring oscillators may be arranged in a differential manner analogous to that exemplarily shown in FIG. 2, or any other suitable manner. As may be understood and appreciated by the skilled person, each of the ring oscillators may be implemented in any suitable manner, depending on various configurations and/or requirements. For instance, in some possible examples, each ring oscillator may comprise a number of inverting stages that are connected in series to form a ring, where N is an odd number larger than 1. Each of the inverting stages may be implemented as (but is certainly not limited thereto) an inverter (a NOT gate), a NOR gate, a NAND gate, or the like. Of course, any other suitable implementation of the ring oscillator may be possible as well, for instance, by using an odd number of inverting stages in combination with a number of non-inverting stages, where the sum of the number of inverting stages and the number of non-inverting stages is larger than 2.

The circuitry may also comprise a chopping logic (e.g., in the form of suitable circuit elements/components) configured to perform a chopping operation for the ring oscillators. In some possible examples, the chopping operation performed by the chopping logic may comprise an up (-modulating/-multiplexing) chopping and/or a down (-modulating/-multiplexing) chopping, or the like. This is not to be limited in the present disclosure.

The circuitry may further comprise a control logic (e.g., in the form of suitable circuit elements/components). More particularly, the control logic may be configured to stop each ring oscillator in a predefined (or predetermined) state. As will be discussed in greater detail below, depending on various implementations of the ring oscillators, each of the ring oscillators may be stopped in the same (predefined/predetermined) state or different states.

After both ring oscillators are stopped, the control logic is further configured to enable the chopping logic to perform the chopping operation. Finally, the control logic is further configured to restart both ring oscillators after the above chopping operation is completed. Configured as such, broadly speaking, the present disclosure generally seeks to avoid the errors that are introduced by the chopping and that are generally caused by neglecting the ring-oscillator cycle (and thus a part of the input signal) during the chopping action. Particularly, the synchronized way of stopping the oscillators avoids timing issues (meta-stability) in the counters or phase-detectors after the oscillators. In other words, as will become apparent below, the techniques proposed in the present disclosure may be understood to fundamentally remove a source of error, whereby the choice of chopping frequency could be decoupled from the input bandwidth and ring oscillator frequency. As a result, the chopping frequency can be made much higher than would be possible in conventional techniques, since there (i.e., in conventional techniques) the error associated with each chopping action would add up to a significant error when chopping at a high chopping frequency. Since, as can be understood and appreciated by the skilled person, chopping generally removes noise up to the chopping frequency. Thus, a higher chopping frequency will in turn remove more noise.

In some example embodiments, both ring oscillators may be stopped by a respective 'disable' signal set by the control logic. As can be understood and appreciated by the skilled person, such signal may have another suitable naming (e.g., 'stop', etc.) and may of course be achieved by any suitable means, such as a logical (e.g., high/low, '1'/'0', etc.) signal or the like, depending on various implementations and/or circumstances.

In some example embodiments, both ring oscillators may be restarted by toggling (e.g., high to low or vice versa), by the control logic, the respective 'disable' signals.

In some example embodiments, the chopping logic may be enabled by the control logic to perform the chopping operation after it is determined that both ring oscillators have been (successfully) stopped.

In some example embodiments, the control logic may be configured to determine that both ring oscillators have been stopped based on receipt of respective feedback signals from both ring oscillators, each feedback signal indicating that the respective ring oscillator has been stopped. Of course, any other suitable implementation may be possible as well. For instance, in some possible cases, the control logic may be simply configured to wait long enough to be sure that both ring oscillators have been successfully stopped.

In some example embodiments, if the pair of ring oscillators are stopped at different states, the control logic may be further configured to determine and compensate for phase differences between respective outputs of the pair of ring oscillators that are caused by the pair of ring oscillators being stopped at different states. This compensation may be achieved by any suitable means. For instance, in some possible cases, the control logic may comprise capacitors (or the like) to store the input charges for the respective oscillators during the chopping operation/process.

In some example embodiments, the control logic may comprise a respective mutex cell for each ring oscillator. The mutex cell may be a conventional mutex cell in the art or the like. This should not be construed to be limiting the present disclosure. Particularly, the mutex cell may be configured for synchronizing operations of the ring oscillators with their states.

In some example embodiments, each ring oscillator may comprise a first inverter, a second inverter, and a NOR gate that are connected in series to form a ring. Particularly, for each ring oscillator: an output signal of the NOR gate, denoted as 'clk1' (or any other suitable naming), may be input to the first inverter; an output signal of the first inverter, denoted as 'clk2' (or any other suitable naming), may be input to the second inverter; an output signal of the second inverter, denoted as 'clk3' (or any other suitable naming), may be input to the NOR gate. Specifically, the 'clk1' and "clk2" signals may be used for determining a point in time for stopping the respective ring oscillator; and an inverted version of the 'clk3' signal (e.g., by passing the 'clk3' signal through an inverter or the like), denoted as 'clk' (or any other suitable naming), may be used as an output of the respective ring oscillator and for determining whether the respective ring oscillator has been stopped.

In some example embodiments, the mutex cell may be configured to grant a 'disable' signal for stopping the respective ring oscillator if an OR-ed output of the 'clk1' and 'clk2' signals (e.g., by connecting the 'clk1' and 'clk2' signals to an OR gate) corresponds to a first logical state (e.g., logical '0' (low) or the like). Put differently, a grant output of the mutex cell (e.g., G1 output port) may output (grant) a high 'disable' signal only when the OR-ed output of the 'clk1' and 'clk2' signals corresponds to the first logical state (e.g., '0'/low). For instance, in the case that the first logical state is represented by '0'/low, this may mean that both the 'clk1' and 'clk2' signals have to be '0'/low, so that the OR-ed output thereof would be '0'/low.

In some example embodiments, the 'disable' signal may be used as another input (other than the other input 'clk3' as mentioned above) of the NOR gate, such that when the 'clk3' signal is in the first logical state (e.g., '0'/low) and the 'disable' signal is in a second logical state (e.g., '1'/high), the 'clk1' signal is in the first logical state (e.g., '0'/low) thereby stopping the respective ring oscillator. As can be understood and appreciated by the skilled person, the first logical state being '0'/low and the second logical state being '1'/high are merely listed for illustrative purposes, but should not be understood to constitute a limitation of any kind. Of course, any other suitable implementation for the first and/or second logical state may be possible as well, e.g., 'TRUE'/'FALSE' or the like, depending on various circumstances and/or requirements.

In some example embodiments, the control logic may further comprise an AND gate for enabling the chopping logic. More particularly, the AND gate may take respective 'clk' and 'disable' signals of both ring oscillators as inputs, such that the chopping logic can be ensured to be enabled to perform the chopping operation only when both ring oscillators are stopped. In some example embodiments, the control logic may further comprise a flip-flop unit that takes a clock signal of the chopping logic as its clock input. Accordingly, the flip-flop unit may be configured such that a rising edge of the clock signal of the chopping logic can be used as a start trigger for operations of the control logic.

In some example embodiments, the flip-flop unit may be a D flip-flop. Particularly, a 'D' input of the D flip-flop may be set to the second logical state (e.g., '1'/high); a 'Q' output of the D flip-flop may be coupled to a first request input of the mutex cell (e.g., R1 input port);

and a second request input of the mutex cell (e.g., R2 input port) may be coupled to the OR-ed output of the 'clk1' and 'clk2' signals, so that the 'disable' signal, which is generated at a first grant output of the mutex cell (e.g., G1 output port), may be granted (output '1'/high) when the OR-ed output of the 'clk1' and 'clk2' signals is in the first logical state (e.g., '0'/low). Of course, as can be understood and appreciated by the skilled person, the flip-flop unit may be implemented in any suitable form other than the D flip-flop.

In some example embodiments, the flip-flop unit may be reset after the chopping operation has been completed, thereby restarting both ring oscillators.

In some example embodiments, each ring oscillator may be arranged in the form of serially connected segments, such that each ring oscillator can be stopped in more than one state (or position) each being associated with a respective segment. Similar to the above, in some possible (non-limiting) examples, each segment may be configured to have a respective number M of inverting stages, where M is an odd number larger than 1. Further, the control logic may comprise a respective mutex cell for each segment, such that a respective 'disable' signal granted by one mutex cell may be configured to block operations of the other segments of the respective ring oscillator. Moreover, the control logic may further comprise a phase detection unit configured to determine phase differences between respective outputs of the ring oscillators. Specifically, the phase differences may be determined based on the respective states in which the ring oscillators are stopped.

As briefly indicated above already, the ring oscillator may be implemented in any suitable form. For instance, in some example embodiments, each ring oscillator may comprise a number N of inverting stages that are connected in series to form a ring, where N is an odd number larger than 1. In some other example embodiments, each ring oscillator may comprise a number X of inverting stages and a number Y of non-inverting stages that are connected in series to form a ring, where X is an odd number and X+Y>2.

According to another aspect of the present disclosure, there is provided a method of operating a circuitry for enabling synchronized chopping for ring oscillators. The circuitry may comprise any suitable elements/components as illustrated above with respect to the preceding aspect. In particular, the circuitry may comprise a differentially arranged pair of ring oscillators, a chopping logic; and a control logic. Accordingly, the method may comprise stopping, by the control logic, each ring oscillator in a predefined state; enabling, by the control logic, the chopping logic to perform chopping operation after both ring oscillators are stopped; performing, by the chopping logic, the chopping operation for the ring oscillators; and restarting, by the control logic, both ring oscillators after the chopping operation is completed.

Configured as such, broadly speaking, the present disclosure generally seeks to avoid the errors that are introduced by the chopping and that are generally caused by neglecting the ring-oscillator cycle (and thus a part of the input signal) during the chopping action. Particularly, the synchronized way of stopping the oscillators avoids timing issues (meta-stability) in the counters or phase-detectors after the oscillators. In other words, as will become apparent below, the techniques proposed in the present disclosure may be understood to fundamentally remove a source of error, whereby the choice of chopping frequency could be decoupled from the input bandwidth and ring oscillator frequency. As a result, the chopping frequency can be made much higher than would be possible in conventional techniques, since there (i.e., in conventional techniques) the error associated with each chopping action would add up to a significant error when chopping at a high chopping frequency. Since, as can be understood and appreciated by the skilled person, chopping generally removes noise up to the chopping frequency. Thus, a higher chopping frequency will in turn remove more noise.

Details of the disclosed method may be implemented as systems (e.g., in the form of circuitry) adapted to execute some or all of the steps of the method, and vice versa, as the skilled person will appreciate. In particular, it is understood that methods according to the disclosure relate to methods of operating the systems (or circuitry) according to the above embodiments and variations thereof and that respective statements made with regard to the systems (or circuitry) likewise apply to the corresponding methods, and vice versa.

It is also understood that in the present disclosure, the term "couple" or "coupled" refers to elements being in electrical communication with each other, whether directly connected e.g., via wires or in some other manner (e.g., indirectly). Notably, one example of being coupled is being connected.

BRIEF DESCRIPTION OF THE DRAWINGS

Example embodiments of the disclosure are explained below with reference to the accompanying drawings, wherein like reference numbers may indicate like or similar elements, and wherein FIG. 1 schematically illustrates an example of a possible implementation of a Current Controlled Oscillator (CCO) and a Voltage Controlled Oscillator (VCO), FIG. 2 schematically illustrates an example of a possible implementation of a CCO/VCO arranged in a differential manner, FIG. 3 schematically illustrates an example of a possible implementation of a circuitry according to embodiments of the present disclosure, FIGS. 4A and 4B schematically illustrate examples of possible implementations of ring oscillators with an enable or disable pin respectively, FIG. 5 schematically illustrates another example of a possible implementation of a circuitry according to embodiments of the present disclosure, FIG. 6 schematically illustrates example waveform diagrams of signals of the circuitry corresponding to the preceding example, FIG. 7 schematically illustrates yet another example of a possible implementation of a circuitry according to embodiments of the present disclosure.

DETAILED DESCRIPTION

As indicated above, identical or like reference numbers in the present disclosure may, unless indicated otherwise, indicate identical or like elements, such that repeated descriptions thereof may be omitted for reasons of conciseness.

As briefly mentioned above, broadly speaking, techniques related to Current Controlled Oscillators (CCOs) and/or Voltage Controlled Oscillators (VCOs) (such as those exemplarily shown in FIGS. 1 and 2) have become popular recently in analog-to-digital conversion generally because they scale very well with modern processes.

Typically, these CCO/VCO circuits are often used in high-speed and/or medium-resolution applications. In those applications, the 1/f-noise (or sometimes also referred to as flicker-noise) of the ring oscillator is not significant. In high-accuracy applications however, such as audio applications or the like, the 1/f noise of the ring oscillators would be significant and may call for reduction.

In some possible cases, this may be done by using large devices, however at the cost of a lot of additional power consumption. In some other possible cases, the so-called chopping operations may be added.

However, in existing techniques where chopping is applied, it is only done at the gain stage driving the VCOs or CCOs, but not the VCOs or CCOs themselves; or it is done in an asynchronous manner with respect to the frequency of the VCOs/CCOs. As a result, the phase of the oscillators may only be detected with a certain resolution (in case of a counter the resolution is complete cycles of the oscillator). This in turn results in an error during each chopping action in the sense that each oscillator has consumed a certain amount of current which is not yet detected by the phase detector (counter).

This then generally sets a limit to the maximum chopping frequency (otherwise the effects of these errors might add up too much) and therefore further sets a limit to the maximum frequency of the 1/f noise that can be removed. The application in which this is a problem is in low-power audio circuits: low-power means small devices (which then translates to high 1/f noise), whereas audio applications typically require high resolution and therefore low noise in the audio band, which is typically significantly below the 1/f corner frequency.

In view thereof, generally speaking, the present disclosure seeks to propose techniques and/or mechanisms that can overcome some or all of the above-illustrated problems associated with conventional techniques; and more particularly, that can enable synchronized chopping operations and at the same time avoid the errors that are introduced by the chopping.

Figure 3:
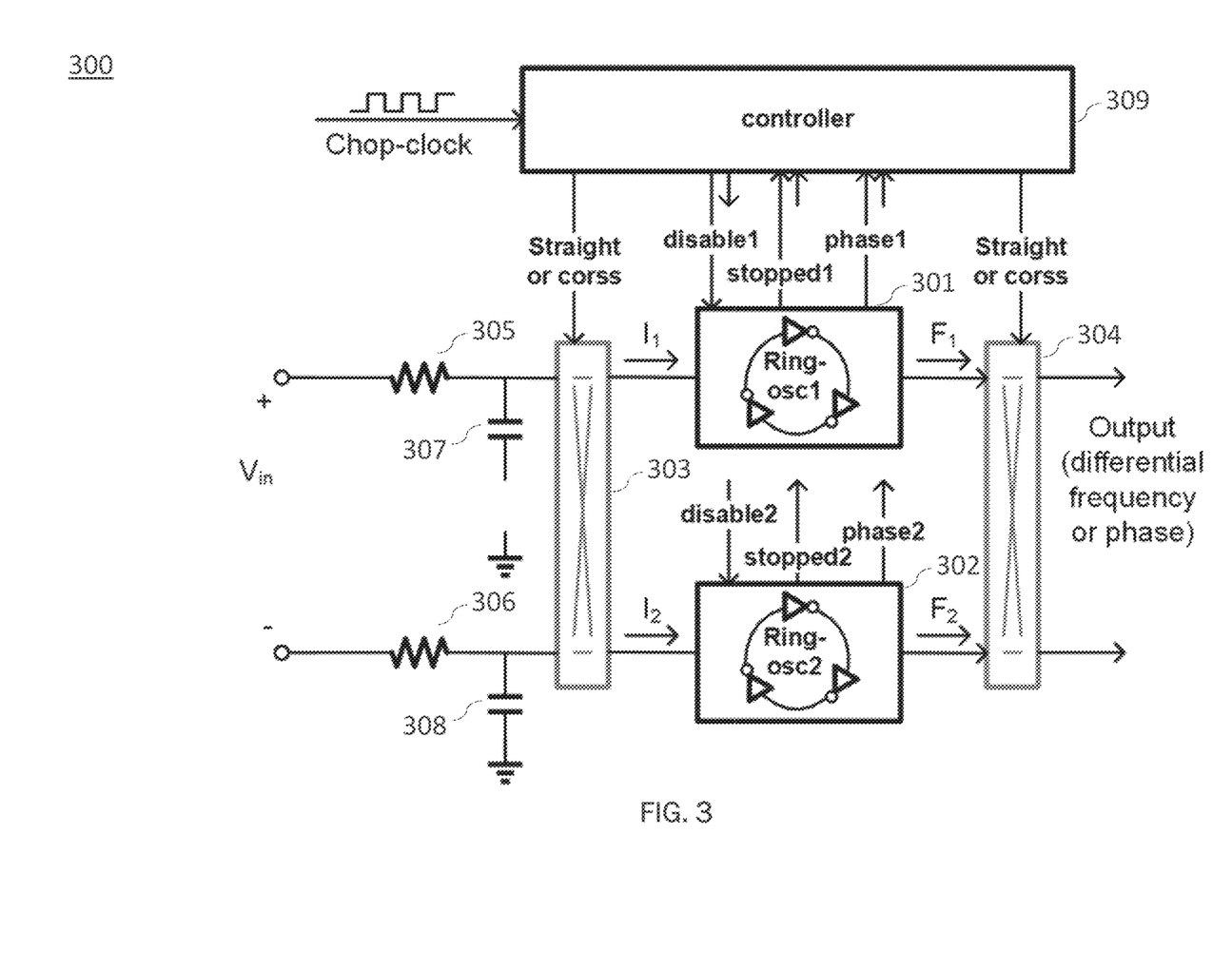

Reference is now made to the illustrative example as shown in FIG. 3, which schematically illustrates a possible implementation of a circuitry 300 according to embodiments of the present disclosure.

As shown in this example, the circuitry 300 comprises a pair of ring-oscillator-implemented CCOs 301 and 302, each of which comprising a suitable number of inverting stages (e.g., inverters or the like) and optionally also a suitable number of non-inverting stages (not explicitly shown in the example of FIG. 3). These two ring oscillators 301 and 302 may be differentially arranged as exemplarily shown in FIG. 2.

The circuitry 300 also comprises a respective chopping multiplexer 303 at the input of the CCOs 301 and 302; and correspondingly a respective chopping multiplexer 304 at the output of the CCOs 301 and 302. These chopping components may be operated in analogy to conventional techniques, such that detailed description thereof is omitted here for the sake of brevity.

Typically, oscillators may be current controlled in a way that a fixed amount of charge would be consumed in each period. Nevertheless, in some possible examples, particularly in the case that the overall system may be voltage-based, resistors 305 and 306 (or suitable gm-stages or the like) may be introduced (as illustratively shown in the example of FIG. 1) that may suitably turn the CCOs into corresponding VCOs.

Moreover, in some possible examples, the circuitry 300 may further comprise capacitors 307 and 308 configured to suitably store possible input charge for the CCOs during the chopping action.

The above components/elements may, at least to some extent, be considered known to the person skilled in the technical field of CCO/VCO.

Nevertheless, it may be worthwhile to highlight that, broadly speaking, it is a way to (synchronously) stop the oscillator in one (or a number of) fixed state(s) without the oscillator consuming a different amount of current to reach that state than when it is not stopped that makes the present disclosure special compared to conventional techniques.

To be specific, as will also be described in more detail later, the circuitry comprises a control logic (or simply referred to as a controller) 309 that is initiated by the chop-clock (i.e., the clock signal of the chopping logic 303, 304). More particularly, the controller 309 may be specifically configured to stop both oscillators in a defined state at the first possible moment after a rising edge of the chop-clock. In the illustrative example of FIG. 3, this may generally mean making/setting the signals 'disable1' and 'disable2' to be TRUE (or '1'/high).

Figure 4A:
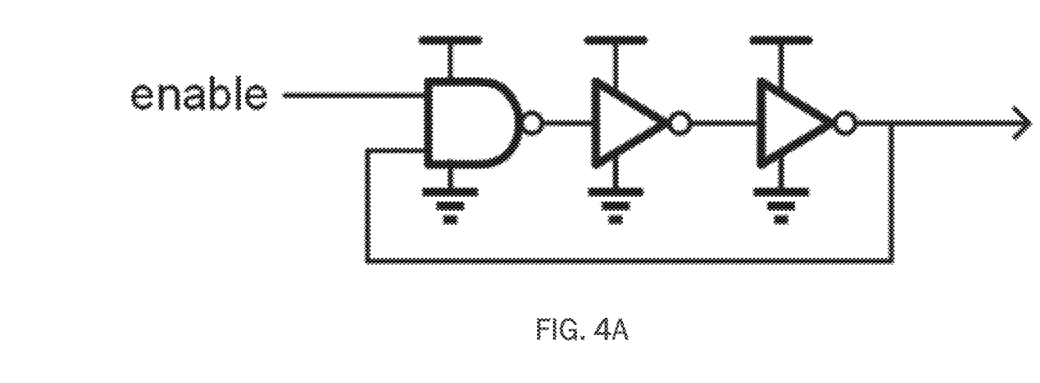
Figure 4B:
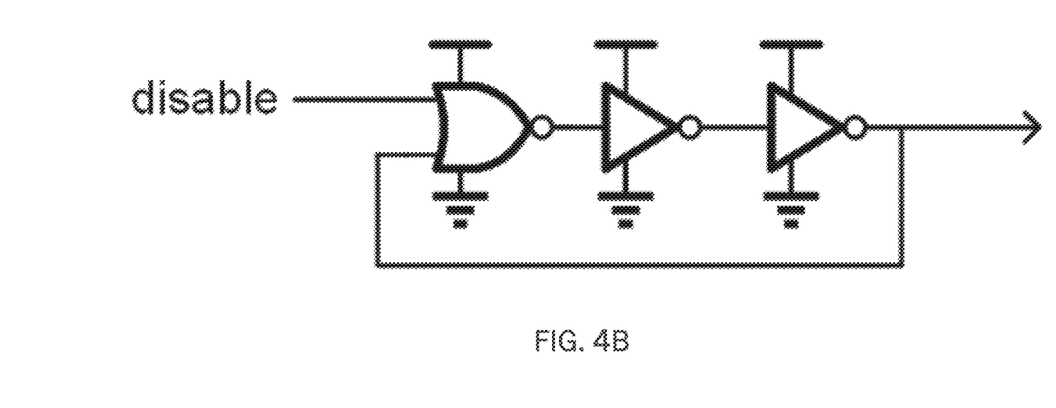

Depending on various implementations, the oscillators 301 and 302 may be stopped by replacing an inverter by a NAND or NOR gate as illustratively depicted in FIGS. 4A and 4B, or by any other suitable means. As will be described in more detail below, the trick is to synchronize the enable or disable signal with the state of the oscillator. Further, the controller 309 may be configured to wait until both oscillators are stopped. Depending on various implementations, this may be achieved either by waiting long enough, or by waiting for feedback signals from the respective oscillators 301, 302. For instance, in the illustrative example of FIG. 3, this may generally mean that feedback signals 'stopped1' and 'stopped2' become TRUE. In some possible examples, the controller 309 may also be configured to enable chopping the oscillators (for example by changing the switches from 'cross' to 'straight' or vice versa, depending on various implementations of the chopping logic 303, 304). Finally, the controller 309 may be configured to restart the oscillators 301, 302. In the illustrative example of FIG. 3, this may generally mean making (e.g., toggling) the signals 'disable1' and 'disable2' to be FALSE (or '0'/low). In some possible examples, particularly in the case that the oscillators 301, 302 could be stopped at a few (i.e., more than one) different states, the controller 309 may also be configured to implement a way to compensate for the phase differences between the two oscillators at the output, for instance, by suitably making use of the signals 'phase1' and 'phase2' as illustratively shown in the example of FIG. 3.

Figure 5:
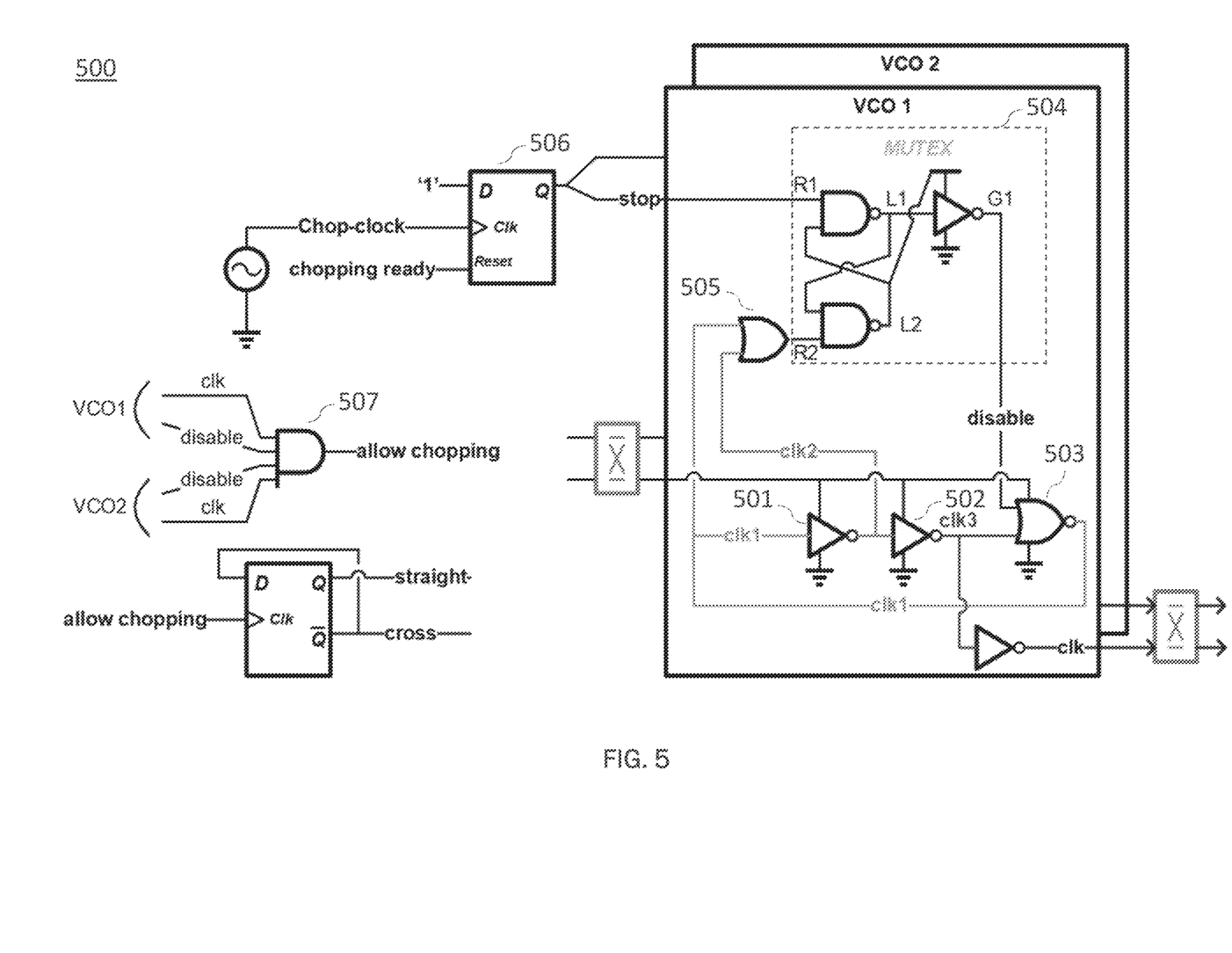

Reference is now made to FIG. 5, which schematically illustrates an example of a possible implementation of a circuitry 500 according to embodiments of the present disclosure. Particularly, this example may be seen to represent a detailed implementation of the schematic example shown in FIG. 3.

Particularly, as shown in the example circuit 500 of FIG. 5, the synchronization of the 'disable' signal with the state of the oscillator may be achieved by a mutex cell 504 which is typically used in a-synchronous logic. Generally speaking, a mutex cell typically has two request input signals (denoted as R1 and R2, respectively). As may be understood and appreciated by the skilled person, request signal R1 may only be granted (meaning output signal G1 becomes high) when request signal R2 is low. Notably, the second grant signal G2, which is present in a conventional mutex-cell, is not needed in the present disclosure and is therefore intentionally left out in the example of FIG. 5.

In the example circuit 500 of FIG. 5, each ring oscillator may comprise a first inverter 501, a second inverter 502, and a NOR gate 503 that are connected in series to form a ring. More particularly, for each ring oscillator, the output signal of the NOR gate 503 (or in other words, the input of the first inverter 501) is denoted as 'clk1'. Similarly, the output signal of the first inverter 501 (or in other words, the input of the second inverter 502) is denoted as 'clk2'; and the output signal of the second inverter 502 (or in other words, the input of the NOR gate 503) is denoted as 'clk3'. Thus, signals clk1, clk2 and clk3 may all be seen as internal signals inside the respective ring oscillator. Moreover, signals clk1 and clk2 may generally be used to detect the correct moment to disable the respective oscillator. Signal clk3 (or more specifically in this example, an inverted version thereof, signal 'clk') may be used as output and to detect if the respective oscillator is stopped. Of course, as noted above already, any other suitable form of the ring oscillator may be used, depending on various implementations and/or circumstances.

According to the present disclosure, a rising edge of the chop-clock can happen at any time (with respect to the state of the ring oscillator), but the rising of the disable signal is postponed to just before clk3 goes low.

Figure 6:
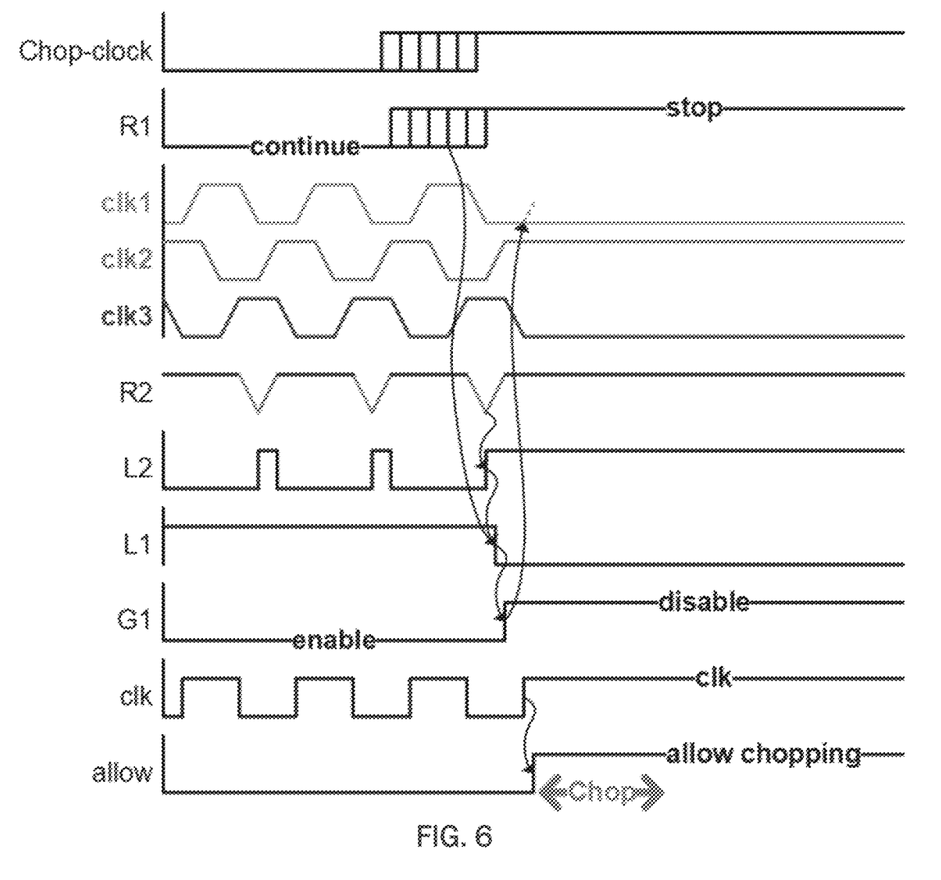

To be more specific, the chop-clock is coupled to the clock input of a D flip-flop 506. The D input of the flip-flop 506 is always set to '1'. As is also illustratively shown in the corresponding waveform diagrams of FIG. 6 (more particularly the arrows therein), a rising edge of the chop-clock will trigger the start of the complete chop sequence. It will make the request signal R1 'stop' (which is coupled to the Q output of the flip-flop 506) high. As illustrated above, that request signal is only granted when the other request signal R2 is low.

The signal R2 is equal to an OR function (e.g., via an OR gate 505) of signals clk1 and clk2. When both of these signals are '0', R2 will become low. Notably, in that situation, clk3 is still '1' and is about to become '0'. That may be seen as an ideal moment to make the 'disable' signal high thereby stopping the respective ring oscillator. By doing so, it also prevents the output of the NOR gate 503 (i.e., signal clk1) from becoming high when signal clk3 becomes low.

The stopping of the respective ring oscillator is finished (and can be detected) when clk3='0' and 'disable'='1'. At that time, the ring oscillator will not consume any dynamic current anymore. When that is the case for both oscillators (VCO1 and VCO2), it would be safe to apply chopping. In the illustrative example of FIG. 5, this is achieved by connecting the respective 'clk' and 'disable' signals of VCO1 and the respective 'clk' and 'disable' signals of VCO2 all to an AND gate 507. Incidentally, it may be noted that the combination of the 'clk' and 'disable' signals of one oscillator may be collectively seen to represent the respective feedback signal ('stopped1'/'stopped2') in the example of FIG. 3. The output signal 'allow chopping' of said AND gate 507 may then be used to control (enable) the actual chopping process (e.g., by setting the switches of the input/output chopping multiplexer from 'cross' to 'straight' or vice versa).

In some possible examples, during the time the oscillator is stopped, the input current may be temporarily stored in an input capacitor and could be consumed when that oscillator is restarted again (e.g., making it temporarily run faster to correct for this idle time). So, if one oscillator is stopped slightly earlier than the other, this will not result in a significant overall error (although it can result in a small error in case the oscillators are not perfectly linear).

When chopping is completed (not explicitly shown in FIGS. 5 and 6), for example by detecting whether the switches of the choppers are in the correct new state ('straight'/'cross')), the 'stop' output of the D flip-flop 506 may be reset (for example, via the 'chopping ready' signal), so that both oscillators could be restarted.

Figure 7:
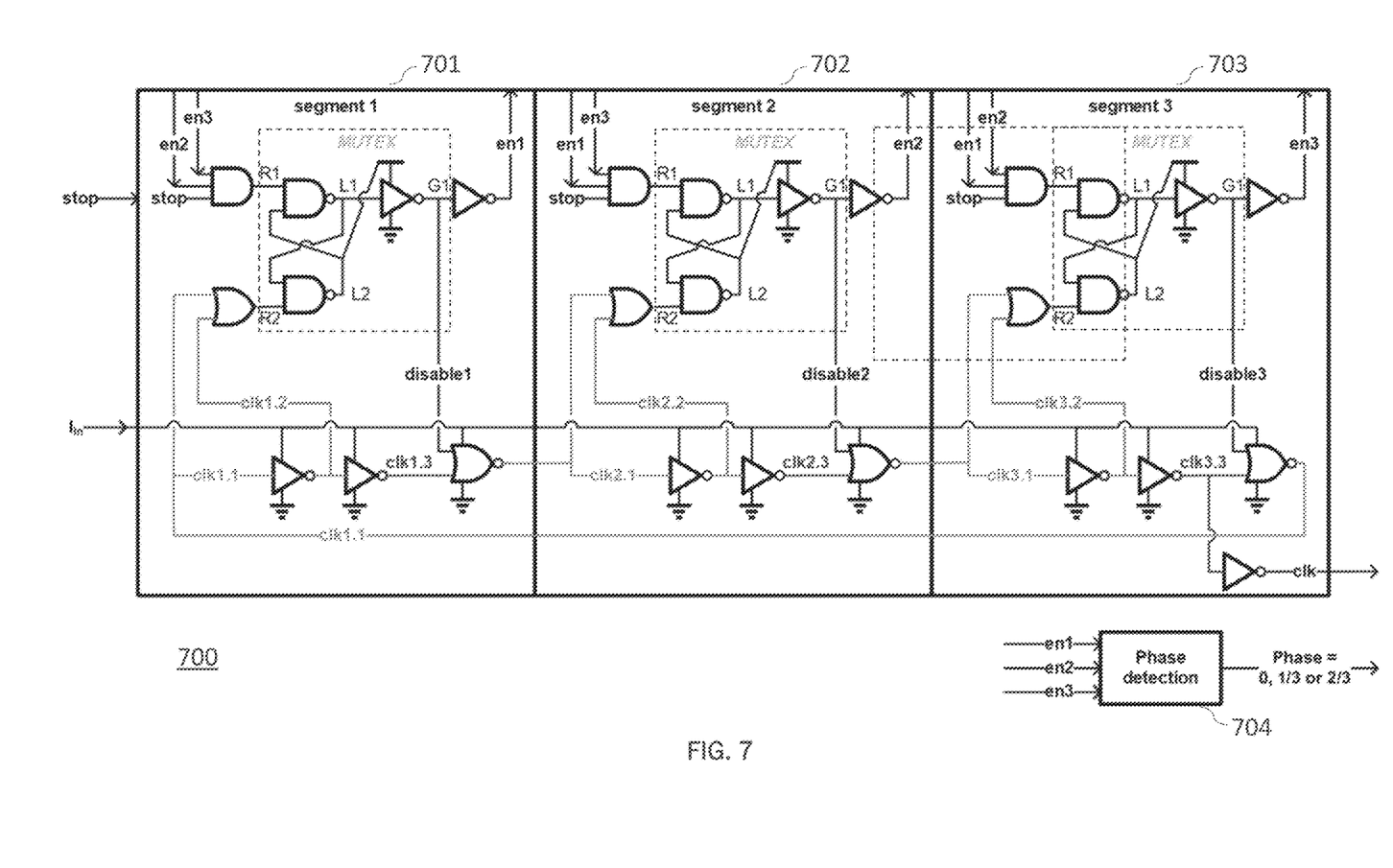

FIG. 7 schematically illustrates yet another example of a possible implementation of a circuitry 700 according to embodiments of the present disclosure.

One of the general ideas behind this specific example is that the ring oscillator may have more inverting stages (than three in the example of FIG. 5). As a result, this would give more options to detect the correct moment for the 'disable' signal to become high (or in some other possible implementations, the 'enable' signal becoming low). Furthermore, the ring oscillator may also have more positions (states) in which it can be stopped.

Accordingly, as illustratively shown in the example circuitry 700 of FIG. 7, a ring oscillator is arranged in the form of three serially coupled segments 701, 702 and 703 (in other words, three possible stop positions), each having three inverting stages (resulting in a total of nine inverting stages in this ring oscillator).

Specifically, each stop position may have its own mutex cell to control the corresponding 'disable' signal. Moreover, by appropriately connecting 'en1', 'en2', 'en3' and 'stop' signals as illustratively shown in the example circuitry 700 of FIG. 7, the first mutex cell that is successfully granted would then properly block the others.

Moreover, as also shown in FIG. 7, signals 'en1', 'en2' and 'en3' may also be used by a phase detection logic 704 in order to detect/determine (and possibly also for further compensation) the phase difference between the outputs of the oscillators. For instance, as a simple (non-limiting) example for illustrative purposes, assuming that CCO1/VCO1 may be stopped in the position/state associated with segment 1 701 whilst CCO2/VCO2 may be stopped in the position/state associated with segment 3 703, then it may be determined/derived, e.g., with the help of the phase detection logic 704, that the phase difference is ⅔.

Notably, one of the advantages of having more segments is that this may reduce the output frequency (resulting in less power consumption in the counter) without sacrificing the timing resolution. The fractional frequency (phase being 0, ⅓ or ⅔) is only calculated during a "chop" and thus doesn't add too much power consumption.

Figure 8:
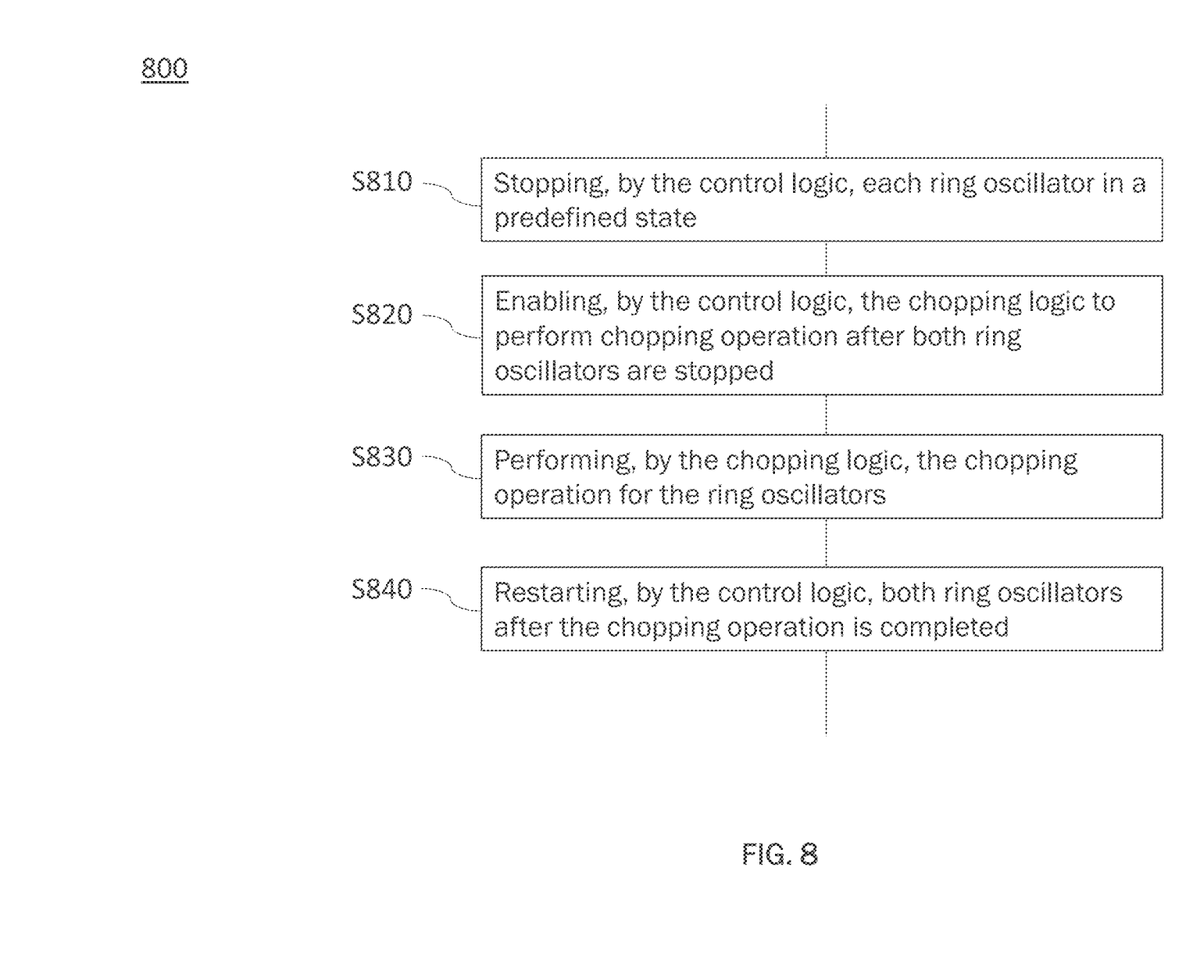
FIG. 8 is a flowchart schematically illustrating an example of a method of operating a circuitry according to embodiments of the present disclosure.

Finally, a flowchart illustrating an example of a method 800 of operating a circuitry for enabling synchronized chopping for ring oscillators is schematically shown in FIG. 8. The circuitry may be implemented in accordance with the possible embodiments as described above with respect to FIGS. 3, 5 and 7, or the like. For example, the circuitry may comprise a differentially arranged pair of ring oscillators, a chopping logic, and a control logic.

In particular, method 800 may comprise, at step S810, stopping, by the control logic, each ring oscillator in a predefined state. Method 800 may further comprise, at step S820, enabling, by the control logic, the chopping logic to perform chopping operation after both ring oscillators are stopped. In addition, method 800 may also comprise, at step S830, performing, by the chopping logic, the chopping operation for the ring oscillators. Finally, method 800 may comprise, at step S840, restarting, by the control logic, both ring oscillators after the chopping operation is completed.

Configured as proposed above, broadly speaking, broadly speaking, the present disclosure generally seeks to avoid the errors that are introduced by the chopping that are generally caused by neglecting the ring-oscillator cycle (and thus a part of the input signal) during the chopping action. Particularly, the synchronized way of stopping the oscillators avoids timing issues (meta-stability) in the counters or phase-detectors after the oscillators. In other words, as will become apparent below, the techniques proposed in the present disclosure may be understood to fundamentally remove a source of error, whereby the choice of chopping frequency could be decoupled from the input bandwidth and ring oscillator frequency. As a result, the chopping frequency can be made much higher than would be possible in conventional techniques, since there (i.e., in conventional techniques) the error associated with each chopping action would add up to a significant error when chopping at a high chopping frequency. Since, as can be understood and appreciated by the skilled person, chopping generally removes noise up to the chopping frequency. Thus, a higher chopping frequency will in turn remove more noise.

It may be worth noting that, the exemplary implementations using transmitter and receiver coils that may appear to have a specific wound, arrangement or placement as shown in the figures are merely provided for possible illustrative purposes, but are certainly not to be understood as a limitation of any kind. As can be understood and appreciated by the skilled person, any other suitable arrangement, implementation and/or application may be adopted. It should be noted that the apparatus/device features described above correspond to respective method features that may however not be explicitly described, for reasons of conciseness. The disclosure of the present document is considered to extend also to such method features. In particular, the present disclosure is understood to also relate to methods of manufacturing and/or operating the circuits described above, and/or to providing and/or arranging respective elements of these circuits.

It is to be further noted that examples of embodiments of the disclosure are applicable to various applications or system configurations, depending on the underlying technical fields. In other words, the examples (such as the power tools) shown in the above-described figures, which are used as a basis for the above discussed examples, are only illustrative and do not limit the present disclosure in any way. That is, additional further existing and proposed new functionalities available in a corresponding operating environment may be used in connection with examples of embodiments of the present disclosure based on the principles defined.

It should also be noted that the disclosed example embodiments can be implemented in many ways using hardware and/or software configurations. For example, the disclosed embodiments may be implemented using dedicated hardware, dedicated software, and/or hardware in association with software executable thereon. The components and/or elements in the figures are examples only and do not limit the scope of use or functionality of any hardware, software in combination with hardware, firmware, embedded logic component, or a combination of two or more such components implementing particular embodiments of the present disclosure.

Finally, it should be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiments outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

The invention claimed is:

1. A circuitry for enabling synchronized chopping for ring oscillators, the circuitry comprising:
   a differentially arranged pair of ring oscillators;
   a chopping logic configured to perform a chopping operation for the ring oscillators; and
   a control logic configured to:
      stop each ring oscillator in a predefined state;
      enable the chopping logic to perform the chopping operation after both ring oscillators are stopped; and
      restart both ring oscillators after the chopping operation is completed.

2. The circuitry according to claim 1, wherein both ring oscillators are stopped by a respective 'disable' signal set by the control logic.

3. The circuitry according to claim 2, wherein both ring oscillators are restarted by toggling, by the control logic, the respective 'disable' signals.

4. The circuitry according to claim 1, wherein the chopping logic is enabled by the control logic after it is determined that both ring oscillators have been stopped.

5. The circuitry according to claim 4, wherein the control logic is configured to determine that both ring oscillators have been stopped based on receipt of respective feedback signals from both ring oscillators, each feedback signal indicating that the respective ring oscillator has been stopped.

6. The circuitry according to claim 1, wherein if the pair of ring oscillators are stopped at different states, the control logic is further configured to determine and compensate for phase differences between respective outputs of the pair of ring oscillators that are caused by the pair of ring oscillators being stopped at different states.

7. The circuitry according to claim 1, wherein the control logic comprises a respective mutex cell for each ring oscillator for synchronizing operations of the ring oscillators with their states.

8. The circuitry according to claim 7, wherein
   each ring oscillator comprises a first inverter, a second inverter, and a NOR gate that are connected in series to form a ring; and
   wherein for each ring oscillator:
      an output signal of the NOR gate, denoted as 'clk1', is input to the first inverter;
      an output signal of the first inverter, denoted as 'clk2', is input to the second inverter;
      an output signal of the second inverter, denoted as 'clk3', is input to the NOR gate;
      the 'clk1' and "clk2" signals are used for determining a point in time for stopping the respective ring oscillator; and
      an inverted version of the 'clk3' signal, denoted as 'clk', is used as an output of the respective ring oscillator and for determining whether the respective ring oscillator has been stopped.

9. The circuitry according to claim 8, wherein the mutex cell is configured to grant a 'disable' signal for stopping the respective ring oscillator if an OR-ed output of the 'clk1' and 'clk2' signals corresponds to a first logical state.

10. The circuitry according to claim 9, wherein the 'disable' signal is used as another input of the NOR gate, such that when the 'clk3' signal is in the first logical state and the 'disable' signal is in a second logical state, the 'clk1' signal is in the first logical state thereby stopping the respective ring oscillator.

11. The circuitry according to claim 10, wherein the control logic further comprises an AND gate for enabling the chopping logic, the AND gate taking respective 'clk' and 'disable' signals of both ring oscillators as inputs, such that the chopping logic is enabled when both ring oscillators are stopped.

12. The circuitry according to claim 11, wherein
the control logic further comprises a flip-flop unit that takes a clock signal of the chopping logic as its clock input; and
the flip-flop unit is configured such that a rising edge of the clock signal of the chopping logic can be used as a start trigger for operations of the control logic.

13. The circuitry according to claim 12, wherein
the flip-flop unit is a D flip-flop;
a 'D' input of the D flip-flop is set to the second logical state;
a 'Q' output of the D flip-flop is coupled to a first request input of the mutex cell; and
a second request input of the mutex cell is coupled to the OR-ed output of the 'clk1' and 'clk2' signals, so that the 'disable' signal, which is generated at a first grant output of the mutex cell, is granted when the OR-ed output of the 'clk1' and 'clk2' signals is in the first logical state.

14. The circuitry according to claim 12, wherein the flip-flop unit is reset after the chopping operation has completed, thereby restarting both ring oscillators.

15. The circuitry according to claim 13, wherein the flip-flop unit is reset after the chopping operation has completed, thereby restarting both ring oscillators.

16. The circuitry according to claim 1, wherein
each ring oscillator is arranged in the form of serially connected segments, such that each ring oscillator can be stopped in more than one state each being associated with a respective segment;
the control logic comprises a respective mutex cell for each segment, such that a 'disable' signal granted by one mutex cell is configured to block operations of the other segments of the respective ring oscillator; and
the control logic further comprises a phase detection unit configured to determine phase differences between respective outputs of the ring oscillators, wherein the phase differences are determined based on the respective states in which the ring oscillators are stopped.

17. The circuitry according to claim 1, wherein each ring oscillator comprises a number N of inverting stages that are connected in series to form a ring, where N is an odd number larger than 1.

18. The circuitry according to claim 1, wherein each ring oscillator comprises a number X of inverting stages and a number Y of non-inverting stages that are connected in series to form a ring, where X is an odd number and X+Y>2.

19. A method of operating a circuitry for enabling synchronized chopping for ring oscillators, wherein the circuitry comprises:
a differentially arranged pair of ring oscillators;
a chopping logic; and
a control logic; and
wherein the method comprises:
stopping, by the control logic, each ring oscillator in a predefined state;
enabling, by the control logic, the chopping logic to perform chopping operation after both ring oscillators are stopped;
performing, by the chopping logic, the chopping operation for the ring oscillators; and
restarting, by the control logic, both ring oscillators after the chopping operation is completed.

\* \* \* \* \*